(12) United States Patent
Nagahara

(10) Patent No.: US 6,435,028 B1
(45) Date of Patent: Aug. 20, 2002

(54) ACCELERATION SENSOR

(75) Inventor: Teruaki Nagahara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 10 days.

(21) Appl. No.: 09/630,429

(22) Filed: Aug. 1, 2000

(30) Foreign Application Priority Data

Feb. 25, 2000 (JP) ........................................ 2000-049049

(51) Int. Cl.[7] ................................................ G01P 15/00
(52) U.S. Cl. .................................................. 73/514.01
(58) Field of Search ............................. 73/514.01, 488

(56) References Cited

U.S. PATENT DOCUMENTS 5,734,106 A * 3/1998 Caillat ...................... 73/514.01
5,864,062 A * 1/1999 Nagahara et al. ......... 73/514.01
6,323,529 B1 * 11/2001 Nagahara ..................... 257/420

FOREIGN PATENT DOCUMENTS

| JP | 6-242141 | 9/1994 |
| JP | 8-15300 | 1/1996 |
| JP | 11-94506 | 4/1999 |

* cited by examiner

*Primary Examiner*—Richard A. Moller
(74) *Attorney, Agent, or Firm*—Oblon, Spivak, McClelland, Maier & Neustadt, P.C.

(57) ABSTRACT

The size reduction of an acceleration sensor having an acceleration detecting chip (ACa) and a signal processing chip (SCa), can be attained with an improvement in arrangement of both chips. Specifically, the acceleration detecting chip (ACa) is disposed in a through-hole (HL1) formed in the signal processing chip (SCa). A cap (CPa) is provided in order to prevent resin flowing into an acceleration detecting part (AS), when forming a resin encapsulation package.

6 Claims, 13 Drawing Sheets

ACCELERATION SENSOR

BACKGROUND OF THE INVENTION

1. Field of the Invention

The present invention relates to an acceleration sensor used in automobile air bag, anti-lock brake and navigation systems, or other consumer appliances.

2. Description of the Background Art

Recently, many automobiles have been equipped with an air bag system. One of the important devices constituting the air back system is an acceleration sensor for detecting impact. The acceleration sensor is a sensor device that converts the acceleration subject to an object, into an electrical signal and then outputs it.

At present, acceleration sensors are mostly formed as an electron device which contains a semiconductor substrate prepared by photolithography, etching, micromachining, and other techniques. In general, such an acceleration sensor includes an acceleration detecting chip that detects acceleration and outputs it as an electrical signal, and a signal processing chip that processes the output signal from the acceleration detecting chip, converts acceleration to a numerical data or the like, and outputs it.

Meanwhile, to meet demanding requirements of miniaturization and low cost, one which is encapsulated with resin is used to replace a metal case, as an acceleration sensor package.

FIGS. 22 and 23 illustrate one acceleration detecting chip provided in an acceleration sensor. FIG. 22 is a top plan view, and FIG. 23 is a sectional view taken along the line C—C of FIG. 22. An acceleration detecting chip ACg comprises a semiconductor substrate SB that has on its surface an acceleration detecting part AS. For example, a silicon substrate is used for the semiconductor substrate SB.

The acceleration detecting part AS includes a movable electrode ME, and two fixed electrodes FE1 and FE2 disposed so as to surround the movable electrode ME. Each side and bottom of the fixed electrodes FE1 and FE2 is fixed to the surface of the semiconductor substrate SB, in order that these electrodes will not easily swing when the acceleration detecting chip ACg receives impact. On the other hand, the movable electrode ME is mostly unfixed on its bottom but fixed on its side alone, to the semiconductor substrate SB, so that it will easily swing with the impact in the direction indicated by the arrow "P" in FIG. 22.

On the surface of the semiconductor substrate SB, there are formed wiring layer ILc connected to the fixed electrode FE1, wiring layer ILd connected to the fixed electrode FE2, wiring layer ILe connected to the movable electrode ME, and pad electrodes PDa for wire bonding which are connected to the wiring layer ILc to ILe, respectively.

In the acceleration detecting chip ACg so constructed, when it receives the impact in the direction indicated by the arrow "P" in FIG. 22, the distance between the movable electrode ME and fixed electrode FE1 or FE2, is increased or decreased. This causes variations in the electrostatic capacitance value between the movable electrode ME and fixed electrode FE1, and that between the movable electrode ME and fixed electrode FE2. Therefore, according to the amount of the variations in the capacitance values, acceleration can be detected.

FIG. 24 illustrates an acceleration sensor formed by encapsulating, in a resin package PK, a die pad DPc (i.e., a seat for mounting chips) that mounts an acceleration detecting chip ACg and a signal processing chip SCg, together with leads LD. The acceleration detecting chip ACg and signal processing chip SCg are fixed to the die pad DPc by an insulative adhesive, such as silicone resin, epoxy resin, or low-melting glass. The signal processing chip SCg is equipped with a semiconductor substrate that has on its surface signal processing wiring layer, circuit elements, and the like (not shown). That is, FIG. 24 illustrates an acceleration sensor of a SOP (Small Outline Package) type.

On the surface of the signal processing chip SCg, there are formed pad electrodes PDb that receives the output from pad electrodes PDa of the acceleration detecting chip ACg, and pad electrodes PDc that outputs the processed signal via the leads LD to the exterior. There are formed bonding wires WR, composed of Au or the like, which connect the pad electrodes with the leads LD and the pad electrodes each other.

A protection cap CPd is disposed on the acceleration detecting chip ACg, to prevent the resin flowing into the position of the movable electrode ME, when encapsulating the resin package PK. The protection cap CPd has a conductivity, and also functions to shield the acceleration detecting part AS, with a ground potential fed from the exterior via pad electrodes PDf, which are disposed at a location other than that of the protection cap CPd on the acceleration detecting chip ACg.

In the conventional acceleration sensor shown in FIG. 24, the acceleration detecting chip ACg and signal processing chip SCg are provided in a parallel arrangement on the die pad DPc, it is thus forced to use a large die pad, making it difficult to reduce the size of the acceleration sensor.

SUMMARY OF THE INVENTION

According to a first aspect of the present invention, an acceleration sensor comprises an acceleration detecting chip including an acceleration detecting part having a movable part that shifts depending on acceleration, so that the chip outputs an electrical signal depending on the shift of the movable part; a signal processing chip having a through-hole and a circuit for processing the electrical signal from the acceleration detecting chip; and a die pad to which the acceleration detecting chip and the signal processing chip are adhered, wherein the acceleration detecting chip is disposed in the through-hole of the signal processing chip on the die pad.

Since the acceleration detecting chip is disposed in the through-hole of the signal processing chip, the area of the die pad can be lessened than if the acceleration detecting chip and signal processing chip were provided in a parallel arrangement on the die pad. This permits a reduction in the size of the acceleration sensor.

According to a second aspect, the acceleration sensor of the first aspect further comprises: a cap adhered to the signal processing chip so as to cover the through-hole; and a resin encapsulation package covering at least an adhesive portion between the signal processing chip and the cap.

With the resin encapsulation package, more miniaturization and lower cost can be achieved than would be the case with a metal package. In addition, by virtue of the cap, when forming the resin encapsulation package, there is no possibility of the resin flowing into the acceleration detecting part of the acceleration detecting chip.

Preferably, the acceleration detecting chip further comprises an electrode for outputting the electrical signal, and the signal processing chip further comprises an electrode connected via a bonding wire to the electrode of the acceleration detecting chip.

According to a third aspect, in the acceleration sensor of the second aspect, the cap is a plate-like and has a notch about its periphery; an electrical connection between the acceleration detecting chip and the signal processing chip is established at the notch; and the notch is filled with an insulating material.

It is able to realize an acceleration sensor of less thickness because the electrical connection between the acceleration detecting chip and signal processing chip is made at the notch disposed about the periphery of the plate-like cap.

According to a fourth aspect, the acceleration sensor of the first aspect further comprises: a cap adhered to the acceleration detecting chip so as to cover the acceleration detecting part of the acceleration detecting chip; and a resin encapsulation package covering at least an adhesive portion between the acceleration detecting chip and the cap.

With the resin encapsulation package, more miniaturization and lower cost can be achieved than would be the case with a metal package. In addition, by virtue of the cap, when forming the resin encapsulation package, there is no possibility of the resin flowing into the acceleration detecting part of the acceleration detecting chip.

Preferably, the acceleration detecting chip further comprises an electrode for outputting the electrical signal, and the signal processing chip further comprises an electrode connected via a bonding wire to the electrode of the acceleration detecting chip.

According to a fifth aspect, an acceleration sensor comprises: an acceleration detecting chip having a first main surface, a second main surface opposed to the first main surface, and an acceleration detecting part formed in the first main surface, the acceleration detecting part having a movable part that shifts depending on acceleration, so that the chip outputs an electrical signal depending on the shift of the movable part; a signal processing chip having a first main surface, a second main surface opposed to the first main surface, and a circuit that processes the electrical signal from the acceleration detecting chip; a die pad adhered to the second main surface of the acceleration detecting chip; and a resin encapsulation package. In this acceleration sensor, the second main surface of the signal processing chip covers the acceleration detecting part and is adhered to the first main surface of the acceleration detecting chip, and the resin encapsulation package covers at least an adhesive portion between the acceleration detecting chip and the signal processing chip.

Since the acceleration detecting chip is adhered on the second main surface thereof to the die pad, and the second main surface of the signal processing chip is adhered to the first main surface of the acceleration detecting chip, the area of the die pad can be lessened than if the acceleration detecting chip and signal processing chip were provided in a parallel arrangement on the die pad. This permits a reduction in the size of the acceleration sensor. Further, by virtue of the resin encapsulation package, more miniaturization and lower cost can be achieved than would be the case with a metal package. Furthermore, the second main surface of the signal processing chip covers the acceleration detecting part and is adhered to the first main surface of the acceleration detecting chip. Therefore, when forming the resin encapsulation package, there is no possibility of the resin flowing into the acceleration detecting part of the acceleration detecting chip. It is therefore unnecessary to provide a cap covering the acceleration detecting part, and the number of components is thus lessened to reduce the cost.

According to a sixth aspect, in the acceleration sensor of the fifth aspect, the second main surface of the signal processing chip has a concave, and the acceleration detecting part of the acceleration detecting chip is covered in the concave of the signal processing chip.

Since the acceleration detecting part is nested in the concave of the second main surface of the signal processing chip, the movable part can be kept away from the second main surface of the signal processing chip.

Preferably, the acceleration detecting chip further has on the first main surface an electrode for outputting the electrical signal, and the signal processing chip further has on the first main surface an electrode connected via a bonding wire to the electrode of the acceleration detecting chip.

According to a seventh aspect, in the acceleration sensor of the fifth aspect, the acceleration detecting chip further has on the first main surface a first electrode for outputting the electrical signal, a second electrode, and a third electrode that is electrically connected to the second electrode and not covered with the signal processing chip; and that the signal processing chip further has on the second main surface a first electrode connected to the first electrode of the acceleration detecting chip, and a second electrode connected to the second electrode of the acceleration detecting chip. In this acceleration sensor, the second main surface of the signal processing chip is adhered to the first main surface of the acceleration detecting chip, by adhesive that is applied in the form of a frame on the first main surface of the acceleration detecting chip, so as to surround at least the acceleration detecting part.

Since the signal processing chip is further equipped with the first electrode connected to the first electrode of the acceleration detecting chip, and the second electrode connected to the second electrode of the acceleration detecting chip, no bonding wire is needed for making the electrical connection between both chips. This permits an improvement in productivity, without causing any wire sweep which is liable to occur by the use of a bonding wire. Furthermore, the second main surface of the signal processing chip is fixed to the first main surface of the acceleration detecting chip, by adhesive that is applied in the form of a frame on the first main surface of the acceleration detecting chip, so as to surround at least the acceleration detecting part. Therefore, even if these chips cannot be close together, by the presence of the respective electrodes, when forming a resin encapsulation package, there is no possibility of the resin following into the acceleration detecting part. Thereby, it is unnecessary to provide a cap covering the acceleration detecting part, and the number of components is thus lessened to reduce the cost.

According to an eighth aspect, an acceleration sensor comprises: an acceleration detecting chip having a first main surface, a second main surface opposed to the first main surface, and an acceleration detecting part formed in the first main surface, the acceleration detecting part having a movable part that shifts depending on acceleration, so that the chip outputs an electrical signal depending on the shift of the movable part; a signal processing chip having a circuit for processing the electrical signal from the acceleration detecting chip; a die pad having a first main surface adhered to the first main surface of the acceleration detecting chip, and a second main surface opposed to the first main surface; and a resin encapsulation package covering at least an adhesive portion between the acceleration detecting chip and the die pad.

With the resin encapsulation package, more miniaturization and lower cost can be achieved than would be the case with a metal package. In addition, since the acceleration detecting chip is adhered, on the first main surface thereof, to the first main surface of the die pad, when forming the resin encapsulation package, there is no possibility of the resin flowing into the acceleration detecting part of the acceleration detecting chip. Thereby, it is unnecessary to provide a cap covering the acceleration detecting part, and the number of components is thus lessened to reduce the cost.

According to a ninth aspect, in the acceleration sensor of the eighth aspect, the signal processing chip is adhered to the second main surface of the die pad; that the die pad has a through-hole, and the acceleration detecting chip further has on the first main surface an electrode that is exposed in the through-hole of the die pad and outputs the electrical signal to the signal processing chip.

Since the acceleration detecting chip is adhered, on the first main surface thereof, to the first main surface of the die pad, and the signal processing chip is adhered to the second main surface of the die pad, the area of the die pad can be lessened than if the acceleration detecting chip and signal processing chip were provided in a parallel arrangement on the die pad. This permits a reduction in the size of the acceleration sensor. In addition, the acceleration detecting chip further has, on the first main surface thereof, the electrode for outputting an electrical signal which is exposed in the through-hole of the die pad. This enables to establish an electrical connection between the acceleration detecting chip and signal processing chip.

According to a tenth aspect, in the acceleration sensor of the eighth aspect, the acceleration detecting chip has on the first main surface a concave, and the acceleration detecting part is formed in the concave.

Since the acceleration detecting part is formed in the concave, the movable part can be kept away from the first main surface of the die pad.

According to an eleventh aspect, in the acceleration sensor of the eighth aspect, the signal processing chip is adhered to the second main surface of the acceleration detecting chip.

Since the signal processing chip is adhered on the second main surface of the acceleration detecting chip, the area of the die pad can be lessened than if the acceleration detecting chip and signal processing chip were provided in a parallel arrangement on the die pad. This permits a reduction in the size of the acceleration sensor.

Preferably, in the acceleration sensor of eleventh aspect, the acceleration detecting chip further has on the first main surface an electrode for outputting the electrical signal; the die pad further has on the first main surface a wiring layer connected to the electrode of the acceleration detecting chip; and the signal processing chip further has an electrode connected via a bonding wire to the wiring layer of the die pad.

According to a twelfth aspect, in the acceleration sensor of the ninth aspect, the first main surface of the acceleration detecting chip is adhered to the first main surface of the die pad, by adhesive that is applied in the form of a frame on the first main surface of the acceleration detecting chip, so as to surround at least the acceleration detecting part.

Since the first main surface of the acceleration detecting chip is adhered to the first main surface of the die pad, by the adhesive that is applied in the form of a frame to the first main surface of the acceleration detecting chip, so as to surround at least the acceleration detecting part, the movable part of the acceleration detecting part can be kept away from the first main surface of the die pad, by the amount of the thickness of the adhesive.

It is an object of the present invention to reduce the size of an acceleration sensor having an acceleration detecting chip and a signal processing chip, with an improvement in arrangement of these chips.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
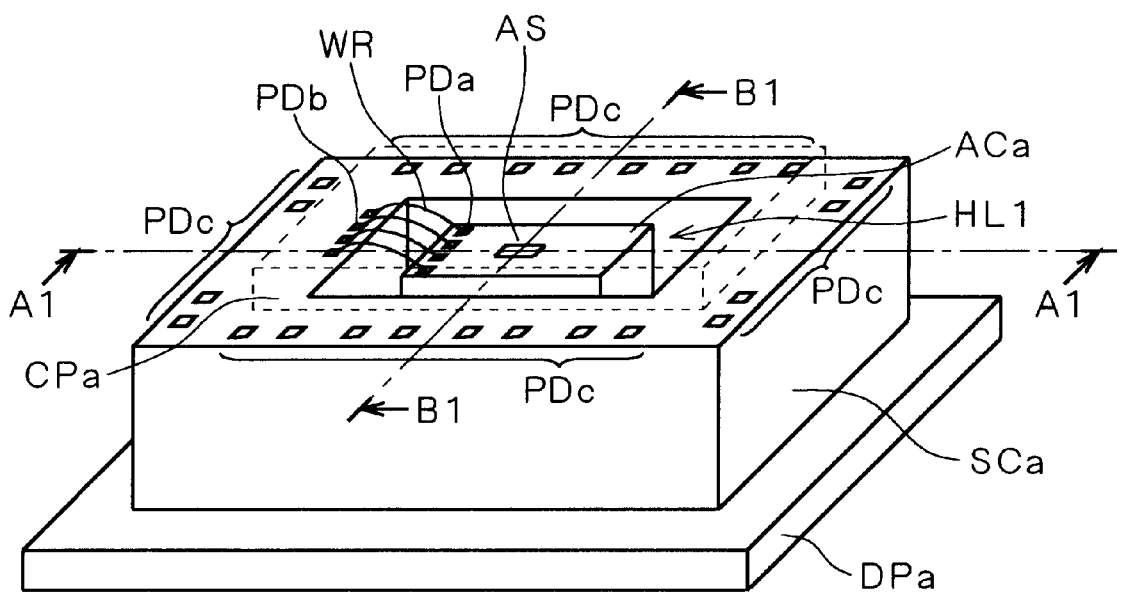
FIG. 1 is a perspective view of an acceleration sensor according to a first preferred embodiment of the invention.
Figure 2:
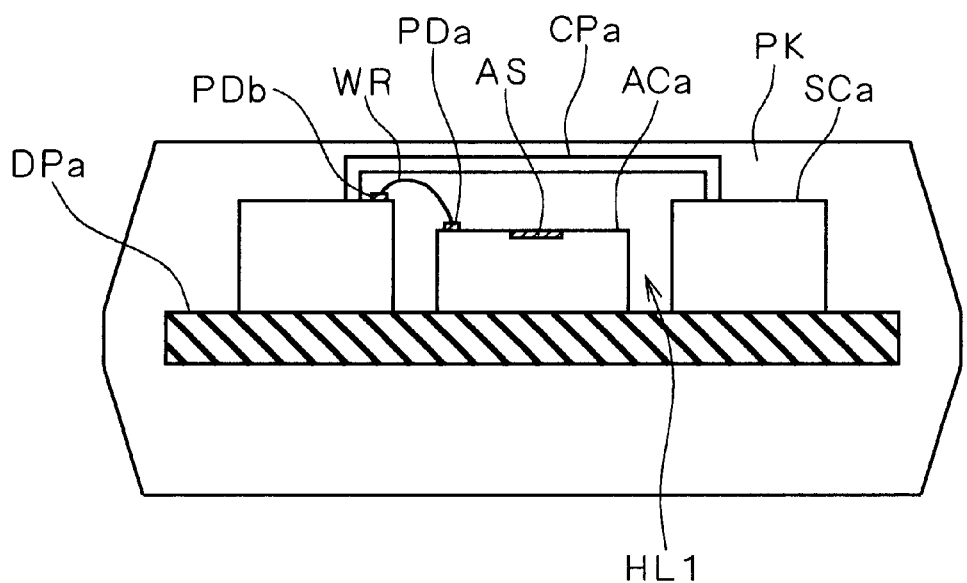
FIGS. 2 and 3 are sectional views of the above acceleration sensor.
Figure 3:
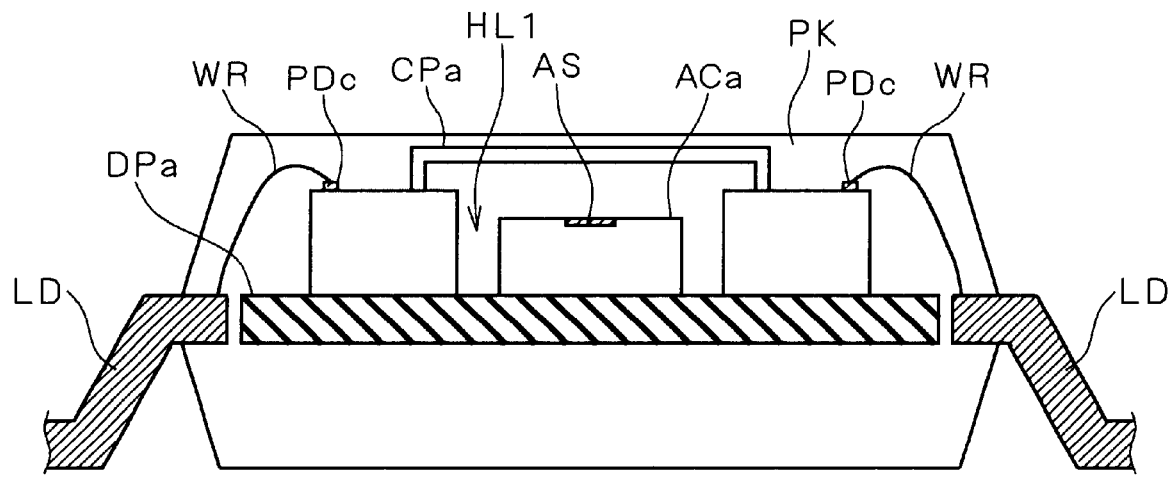

FIGS. 1 to 3 are diagrams illustrating an acceleration sensor according to a first preferred embodiment of the invention. FIG. 1 is a perspective view, FIG. 2 is a sectional view taken along the line A1—A1 of FIG. 1, and FIG. 3 is a sectional view taken along the line B1—B1 of FIG. 1.

The acceleration sensor comprises a die pad DPa and leads LD. Like the above mentioned acceleration detecting chip ACg, an acceleration detecting chip ACa having an acceleration detecting part AS, and a signal processing chip SCa, are mounted on the die pad DPa. The acceleration detecting chip ACa and signal processing chip SCa are fixed to the die pad DPa by an insulative adhesive, such as silicone resin, epoxy resin, or low-melting glass. The die pad DPa, leads LD, acceleration detecting chip ACa and signal processing chip SCa are encapsulated by a resin encapsulation package PK.

For sake of simplicity, the leads LD, bonding wires WR connected to the leads LD, and resin encapsulation package PK are not illustrated in FIG. 1. This preferred embodiment also illustrates an acceleration sensor of the SOP type, as in the conventional acceleration sensor shown in FIG. 24.

The acceleration detecting chip ACa has on its surface pad electrodes PDa for outputting the electrical signal from the acceleration detecting part AS. The signal processing chip SCa has on its surface pad electrodes PDb for receiving the output from the pad electrodes PDa of the acceleration detecting chip ACa, and pad electrodes PDc for outputting the processed signal via the leads LD to the exterior. Like the signal processing chip SCg as described above, signal processing wiring layer, circuit elements, etc. (not shown) are formed on the surface of the signal processing chip SCa. The connection between the pad electrode PDa and pad electrode PDb, and that between the pad electrode PDc and leads LD, are made by a bonding wire WR that is, for example, composed of Au.

Figure 24:
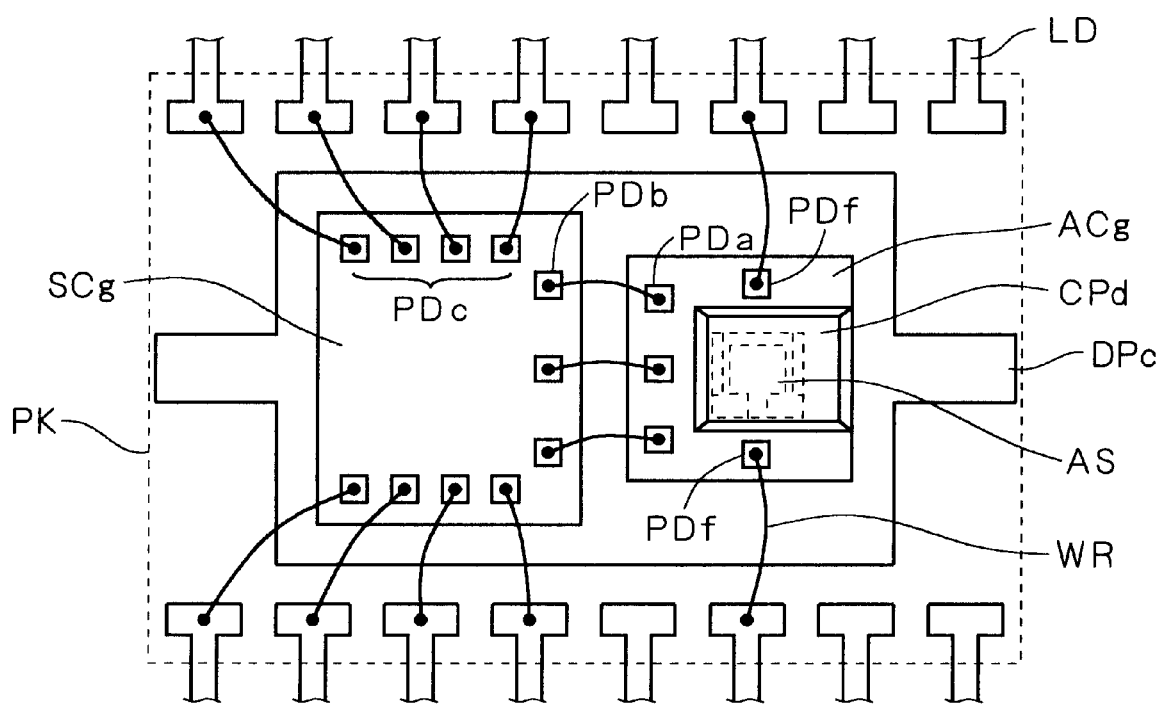
FIG. 24 is a top plan view of a conventional acceleration sensor.

The acceleration sensor of this embodiment differs from the conventional acceleration sensor shown in FIG. 24, in the arrangement of both chips. Specifically, the acceleration detecting chip ACa is disposed in a through-hole HL1 formed in the signal processing chip SCa. This enables to reduce the area of the die pad than if the acceleration detecting chip and signal processing chip were provided in a parallel arrangement on the die pad. It is therefore able to reduce the size of the acceleration sensor.

It should be noted that no circuit for signal processing is, of course, formed in the portion of the surface of the signal processing chip SCa at which the through-hole HL1 is present. The acceleration detecting chip ACa is spaced a certain distance away from the signal processing chip SCa in FIG. 1. Even if these chips are disposed so as to make contact, no problem will occur inasmuch as the insulating property between their respective circuits is retained.

The through-hole HL1 is, for example, formed by the following manner. A circuit for signal processing is formed on the surface of the signal processing chip SCa, and the surface is protected with a photoresist or the like, followed by an etching from the rear surface of the signal processing chip SCa. For this etching, a photolithography technique is employed. That is, with the photoresist, an etching mask is formed and then patterned, thereafter, the signal processing chip SCa is exposed to an etchant.

According to the first preferred embodiment, the acceleration sensor also has a cap CPa covering the through-hole HL1, to prevent the resin flowing into the acceleration detecting part AS, when forming the resin encapsulation package PK. In FIG. 1, the cap CPa is indicated by broken line, in order to show the interior of the through-hole HL1.

The cap CPa is composed of an insulative material, in order not to short the wiring layers and circuits on the surface of the signal processing chip SCa, and it is adhered to the vicinity of the through-hole HL1 on the surface of the signal processing chip SCa, by an insulative adhesive, such as a silicone resin, epoxy resin, or low-melting glass.

If it is desired to make the cap CPa have the function of shielding the acceleration detecting part AS, the surface of the cap CPa, except for the portion making contact with the signal processing chip SCa, may be covered with a conductive material by means such as metal plating.

Thus, since in the first preferred embodiment the acceleration detecting chip ACa is disposed in the through-hole HL1 of the signal processing chip SCa, the size of the acceleration sensor can be lessened than if the former and the latter were provided in a parallel arrangement on the die pad.

Second Preferred Embodiment

A second preferred embodiment is a modification of the acceleration sensor of the first preferred embodiment, and differs in the position of pad electrodes on an acceleration detecting chip and signal processing chip, and in the shape of a cap.

Figure 4:
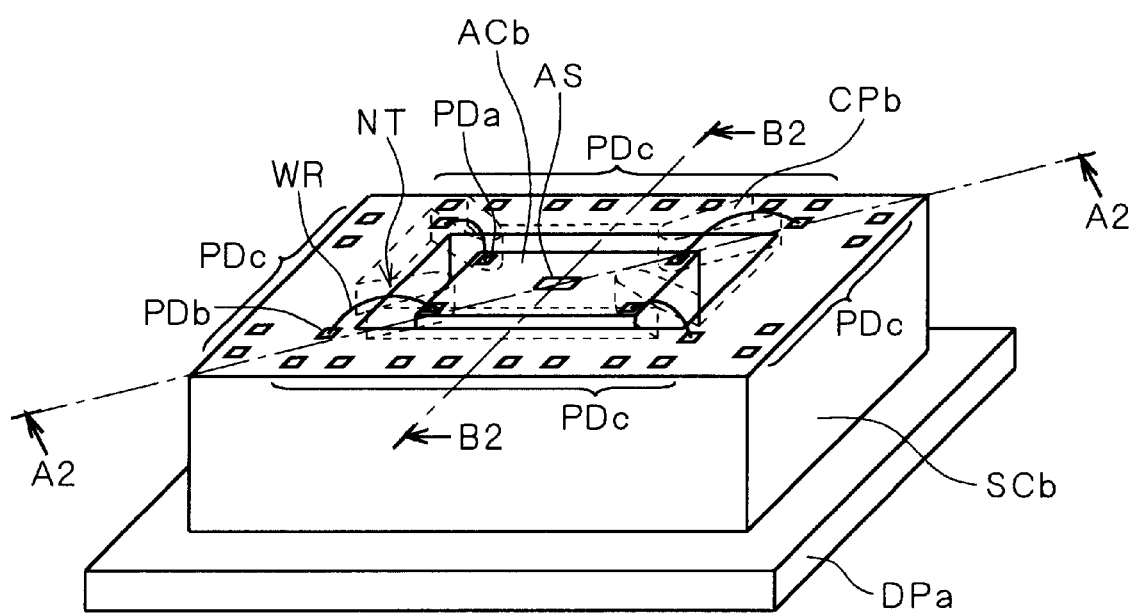
FIG. 4 is a perspective view of an acceleration sensor according to a second preferred embodiment.
Figure 5:
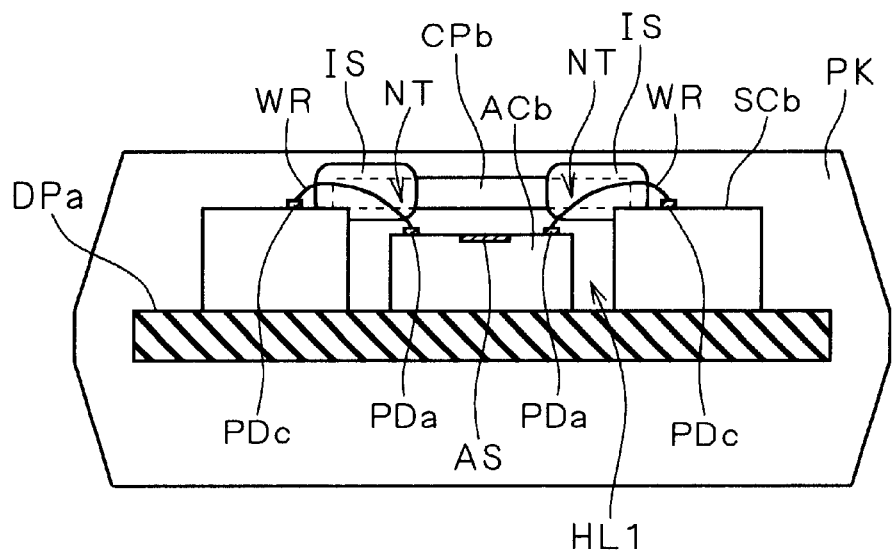
FIGS. 5 and 6 are sectional views of the above acceleration sensor.
Figure 6:
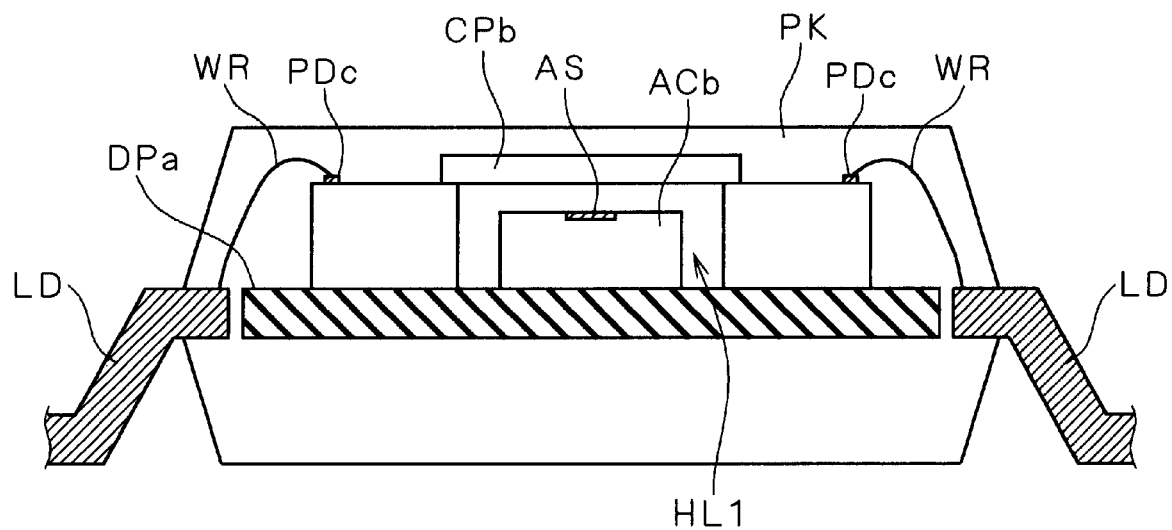

FIGS. 4 to 6 are diagrams illustrating an acceleration sensor according to a second preferred embodiment of the invention. FIG. 4 is a perspective view, FIG. 5 is a sectional view taken along the line A2—A2 of FIG. 4, and FIG. 6 is a sectional view taken along the line B2—B2 of FIG. 4. In FIGS. 4 to 6, the same references have been retained for similar parts which have the same function as in the acceleration sensor of the first preferred embodiment.

The acceleration sensor comprises a die pad DPa and leads LD. Like the above acceleration detecting chip ACa, an acceleration detecting chip ACb having an acceleration detecting part AS, and a signal processing chip SCb, are mounted on the die pad DPa. The acceleration detecting chip ACb and signal processing chip SCb are fixed to the die pad DPa by adhesive, such as silicone resin. The signal processing chip SCb has a through-hole HL1, and the acceleration detecting chip ACb is disposed therein. A cap CPb is formed on the surface of the signal processing chip SCb, so as to cover the through-hole HL1. The die pad DPa, leads LD, acceleration detecting chip ACb, signal processing SCb, and cap CPb are encapsulated by a resin encapsulation package PK.

For sake of simplicity, in FIG. 4, the leads LD, bonding wires WR connected to the leads LD, and resin encapsulation package PK are not illustrated, and the cap CPb is indicated by broken line. The second preferred embodiment also illustrates an acceleration sensor of the SOP type, as in the first preferred embodiment.

The acceleration detecting chip ACb has on its surface pad electrodes PDa for outputting the electrical signal from the acceleration detecting part AS. The signal processing chip SCb has on its surface pad electrodes PDb for receiving the output from the pad electrodes PDa of the acceleration detecting chip ACb, and pad electrodes PDc for outputting the processed signal via the leads LD to the exterior. Like the signal processing chip SCa, signal processing wiring layer, circuit elements, etc. (not shown) are formed on the surface of the signal processing chip SCb. The connection between the pad electrodes PDa and pad electrodes PDb, and that between the pad electrodes PDc and leads LD, are made by a bonding wire WR that is, for example, composed of Au.

Unlike the cap CPa of the first preferred embodiment, the cap CPb of the second preferred embodiment is a plate-like one, and a plurality of notches NT are disposed about the periphery of the cap CPb. At the notches NT, the pad electrodes PDa and PDb are connected by the bonding wires WR, and a high-viscosity insulating material is formed so as to fill the notches NT. Referring to FIGS. 4 to 6, the pad electrodes PDa are provided at the four corners of the acceleration detecting chip ACb, respectively, and the pad electrodes PDb of the signal processing chip SCb which are connected to the pad electrodes PDa are provided in the vicinity of the four corners of the through-hole HL1, respectively.

The plate-like cap CPb having the notches disposed about its periphery is effective in reducing the cap height than the case with the cap CPa of the first preferred embodiment, thus leading to an acceleration sensor of less thickness. Since the notches NT are filled with the insulating material IS, when forming a resin encapsulation package, there is no possibility of the resin flowing into the acceleration detecting part of the acceleration detecting chip. It should be noted that because of high viscosity, the insulating material IS will not reach the acceleration detecting part.

Like the cap CPa, the cap CPb is composed of an insulative material, in order not to short the wiring layers or circuits on the signal processing chip SCb, and it is fixed to the vicinity of the through-hole HL1 on the surface of the signal processing chip SCb, by adhesive such as silicone resin.

If it is desired to make the cap CPb have the function of shielding the acceleration detecting part AS, the surface of the cap CPb, except for the portion making contact with the signal processing chip SCb, may be covered with a conductive material by means such as metal plating.

Other structural features are common to the first preferred embodiment, and its description is thus omitted herein.

Third Preferred Embodiment

A third preferred embodiment is a modification of the acceleration sensor of the first preferred embodiment, and differs only in that a cap covering an acceleration detecting part alone is substituted for the cap covering the through-hole.

Figure 7:
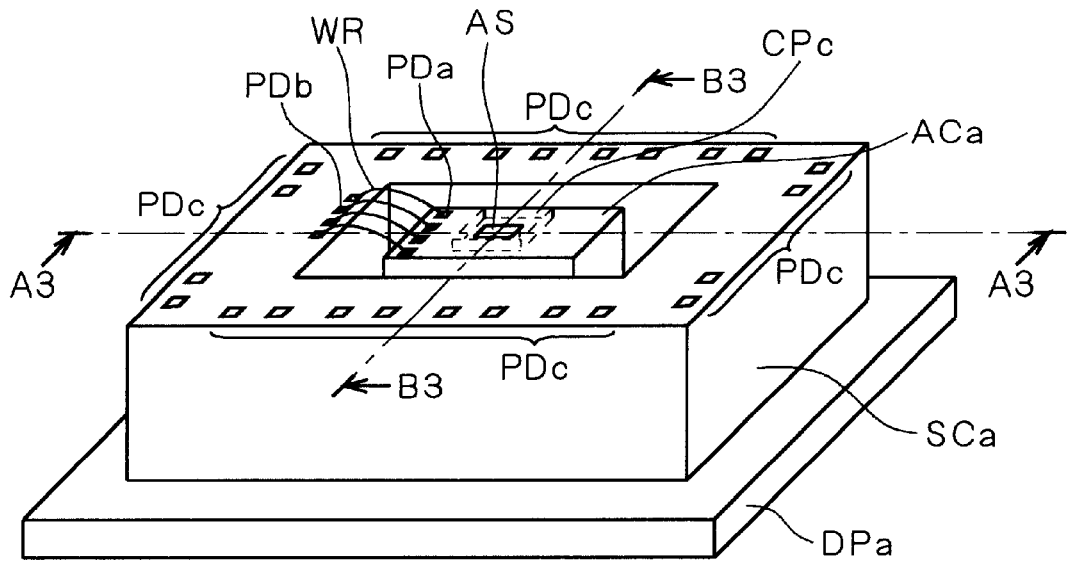
FIG. 7 is a perspective view of an acceleration sensor according to a third preferred embodiment.
Figure 8:
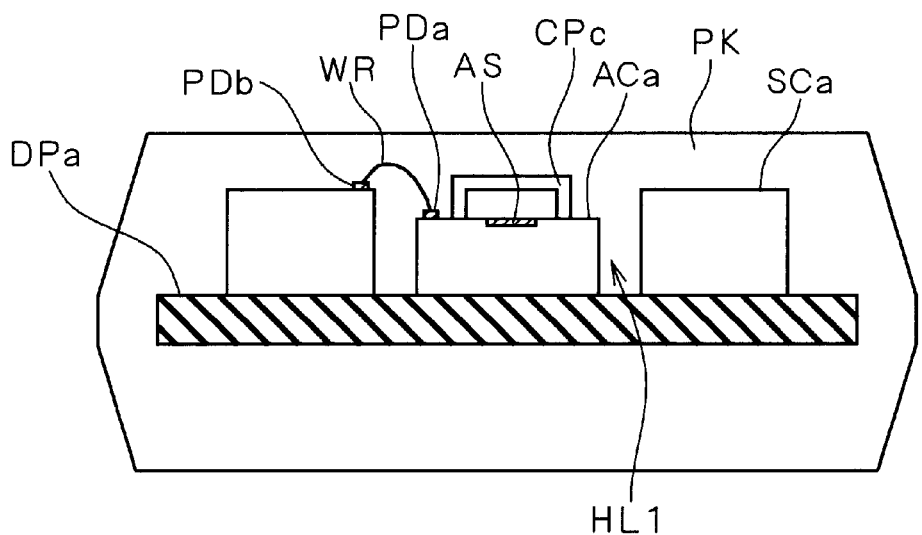
FIGS. 8 and 9 are sectional views of the above acceleration sensor.
Figure 9:
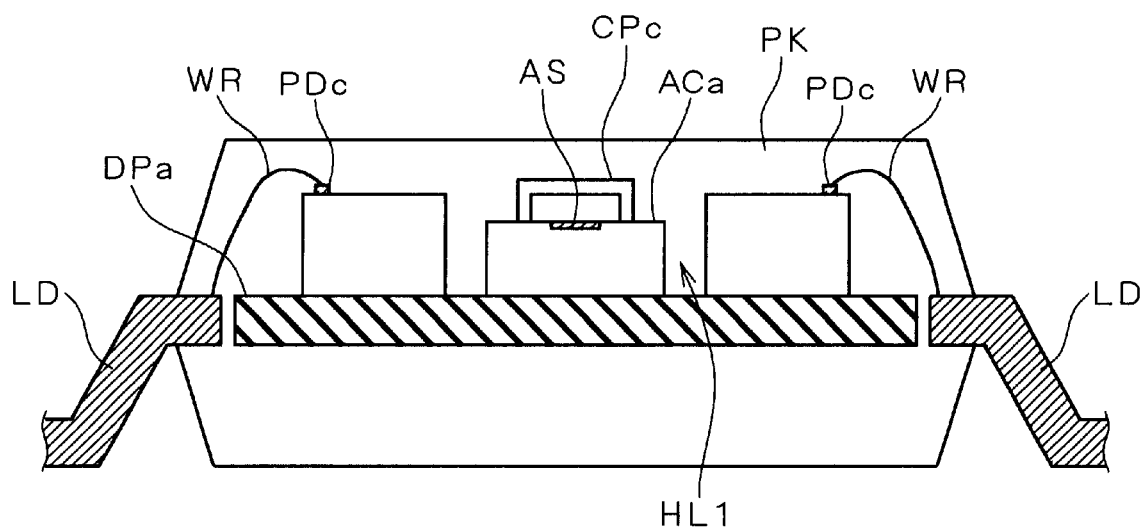

FIGS. 7 to 9 are diagrams illustrating an acceleration sensor according to a third preferred embodiment of the invention. FIG. 7 is a perspective view, FIG. 8 is a sectional view taken along the line A3—A3 of FIG. 7, and FIG. 9 is a sectional view taken along the line B3—B3 of FIG. 7. In FIGS. 7 to 9, the same references have been retained for similar parts which have the same function as the acceleration sensor of the first preferred embodiment.

Unlike the cap CPa of the acceleration sensor in the first preferred embodiment, a cap CPc of the third preferred embodiment is disposed on an acceleration detecting chip ACa, so as to cover only an acceleration detecting part AS. Even with the cap so constructed, when forming a resin encapsulation package, there is no possibility of the resin flowing into the acceleration detecting part AS of the acceleration detecting chip ACa.

The cap CPc is composed of an insulative material, as in the case with the cap CPa, in order not to short the wiring layers or circuits on the acceleration detecting chip ACa, and it is fixed to the vicinity of the acceleration detecting part AS on the surface of the acceleration detecting chip ACa, by adhesive such as silicone resin.

If it is desired to make the cap CPc have the function of shielding the acceleration detecting part AS, the surface of the cap CPc, except for the portion making contact with the acceleration detecting chip ACa, may be covered with a conductive material by means such as metal plating, in the same manner as the cap CPa.

Other structural features are common to the first preferred embodiment, and its description is thus omitted herein.

Fourth Preferred Embodiment

Figure 10:
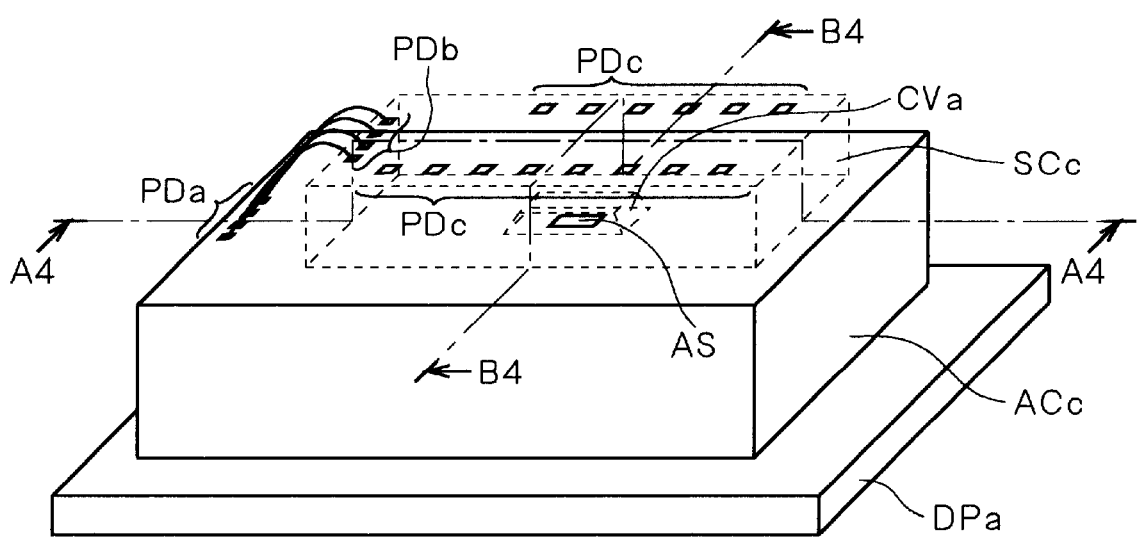
FIG. 10 is a perspective view of an acceleration sensor according to a fourth preferred embodiment.
Figure 11:
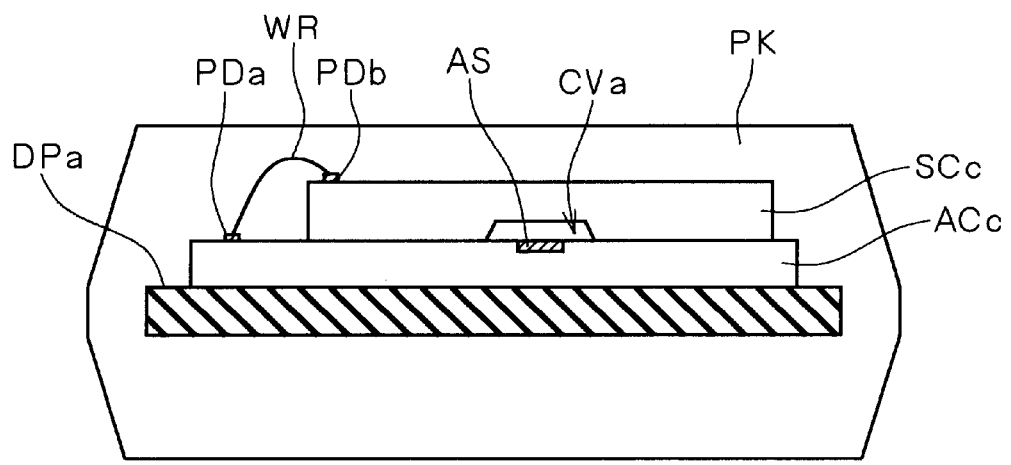
FIGS. 11 and 12 are sectional views of the above acceleration sensor.
Figure 12:
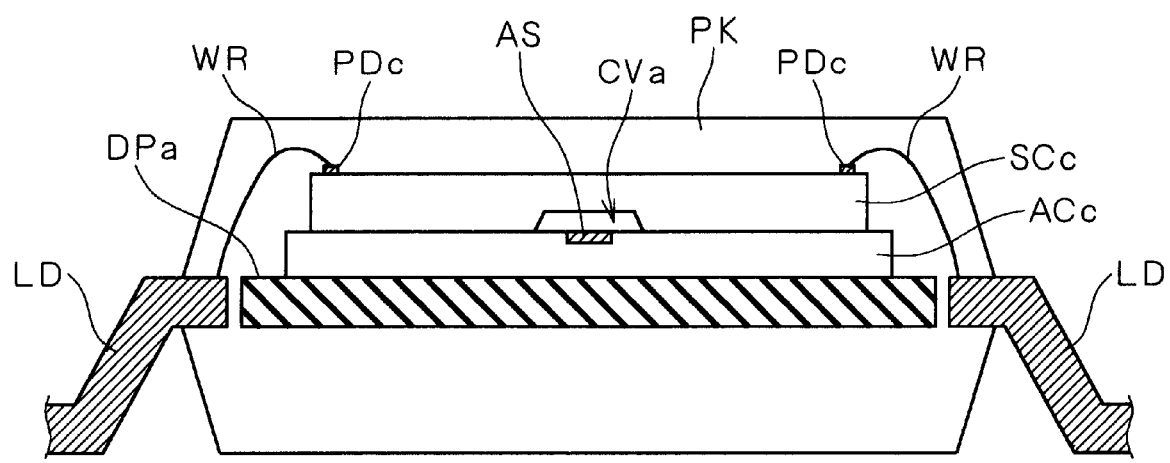

FIGS. 10 to 12 are diagrams illustrating an acceleration sensor according to a fourth preferred embodiment of the invention. FIG. 10 is a perspective view, FIG. 11 is a sectional view taken along the line A4—A4 of FIG. 10, and FIG. 12 is a sectional view taken along the line B4—B4 of FIG. 10.

The acceleration sensor comprises a die pad DPa and leads LD. Disposed on the die pad DPa is an acceleration detecting chip ACc having an acceleration detecting part AS. Disposed on the acceleration detecting chip ACc is a signal processing chip SCc. The acceleration detecting chip ACc and signal processing chip SCc are fixed to the die pad DPa and acceleration detecting chip ACc, respectively, by an insulative adhesive, such as silicone resin. The die pad DPa, leads LD, acceleration detecting chip ACc, and signal processing chip SCc are encapsulated by a resin encapsulation package PK.

For sake of simplicity, in FIG. 10, the leads LD, bonding wires WR connected to the leads LD, and resin encapsulation package PK are not illustrated, and the signal processing chip SCc is indicated by broken line, in order to show the acceleration detecting part AS. The fourth preferred embodiment also illustrates an acceleration sensor of the SOP type, as in the first preferred embodiment.

The acceleration detecting chip ACc has on its surface pad electrodes PDa for outputting the electrical signal from the acceleration detecting part AS. The signal processing chip SCc has on its surface pad electrode PDb for receiving the output from the pad electrodes PDa of the acceleration detecting chip ACc, and pad electrodes PDc for outputting the processed signal via the leads LD to the exterior. Like the signal processing chip SCa, signal processing wiring layer, circuit elements, etc. (not shown) are formed on the surface of the signal processing chip SCc. The connection between the pad electrodes PDa and PDb, and that between the pad electrodes PDc and leads LD, are made by a bonding wire WR that is, for example, composed of Au.

Unlike the acceleration sensor of the first preferred embodiment, in the fourth preferred embodiment the signal processing chip SCc overlies the acceleration detecting chip ACc. This allows for a reduction in the area of the die pad than if the acceleration detecting chip and signal processing chip were provided in a parallel arrangement on the die pad, thereby reducing the size of the acceleration sensor.

Since the signal processing chip SCc is fixed to the acceleration detecting chip ACc by an insulative adhesive, wiring layer (not shown), which transmits the output of the electrical signal from the acceleration detecting part AS to the pad electrodes PDa, may be formed at the region of the surface of the acceleration detecting chip ACc which is covered by the signal processing chip SCc.

A concave CVa is formed in a lower surface of the signal processing chip SCc. The concave CVa is arranged so as to cover, in the concave CVa, the region of the surface of the acceleration detecting chip ACc at which the acceleration detecting part AS is formed. With this arrangement, a movable electrode ME of the acceleration detecting part AS can be kept away from the bottom of the signal processing chip SCc.

Thus, in the acceleration sensor of the fourth preferred embodiment, the bottom of the acceleration detecting chip ACc is adhered to the die pad DPa, and the bottom of the signal processing chip SCc is adhered to the surface of the acceleration detecting chip ACc. This allows for a reduction in the area of the die pad than if the acceleration detecting chip and signal processing chip were provided in a parallel arrangement on the die pad. It is therefore able to reduce the size of the acceleration sensor. In addition, by employing the resin encapsulation package PK that covers the acceleration detecting chip ACc, signal processing chip SCc and die pad DPa, more miniaturization can be achieved than would be the case with a metal package.

Moreover, the acceleration detecting part AS of the acceleration detecting chip ACc is disposed on the surface of the acceleration detecting chip ACc, and the bottom of the signal processing chip SCc is adhered to the surface of the acceleration detecting chip ACc, thereby the acceleration detecting part AS is not subjected to exposure. Therefore, when forming a resin encapsulation package, there is no possibility of the resin flowing into the acceleration detecting part AS. It is unnecessary to provide a cap covering the acceleration detecting part AS, and the number of components is thus lessened to reduce the cost. Furthermore, since the acceleration detecting part AS is covered in the concave CVa on the bottom of the signal processing chip SCc, the movable electrode ME can be kept away from the bottom of the signal processing chip SCc.

Japanese Patent Application Laid-Open No. 6-242141 (1994) and No. 8-15300 (1996) disclose techniques relevant to the acceleration sensor of the fourth preferred embodiment. However, these techniques differ from the present invention for lack of the viewpoint of preventing the flow of resin into the acceleration detecting part AS, when forming a resin encapsulation package.

Fifth Preferred Embodiment

Figure 13:
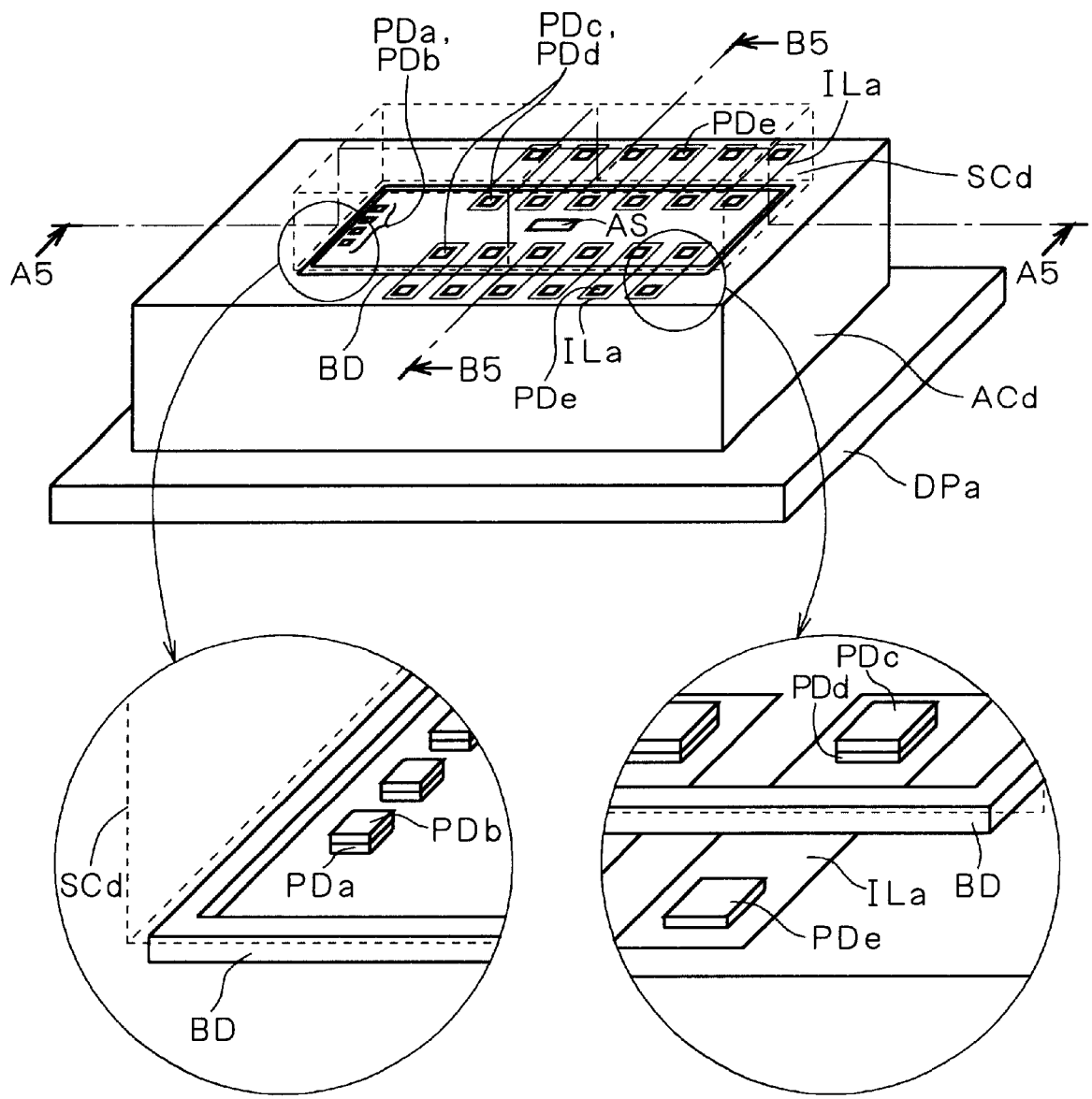
FIG. 13 is a perspective view of an acceleration sensor according to a fifth preferred embodiment.
Figure 14:
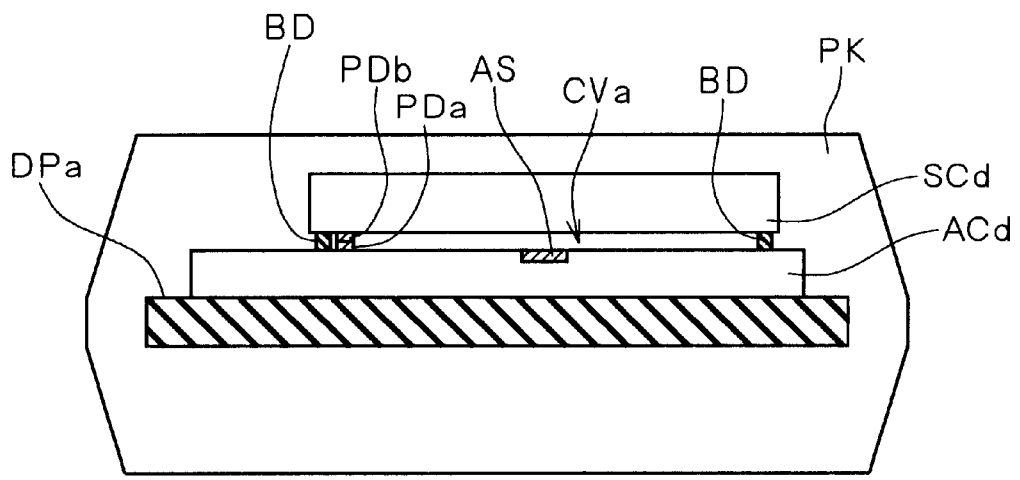
FIGS. 14 and 15 are sectional views of the above acceleration sensor.
Figure 15:
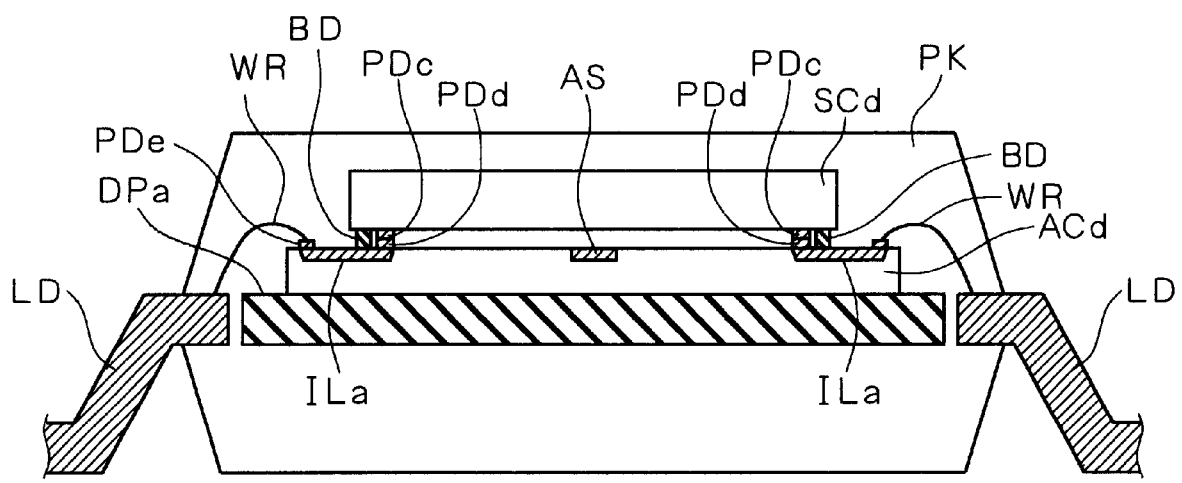

FIGS. 13 to 15 are diagrams illustrating an acceleration sensor according to a fifth preferred embodiment of the invention. FIG. 13 is a perspective view, FIG. 14 is a sectional view taken along the line A5—A5 of FIG. 13, and FIG. 15 is a sectional view taken along the line B5—B5 of FIG. 13.

The acceleration sensor comprises a die pad DPa and leads LD. Disposed on the die pad DPa is an acceleration detecting chip ACd having an acceleration detecting part AS. Disposed on the acceleration detecting chip ACd is a signal processing chip SCd. The acceleration detecting chip ACd is fixed to the die pad DPa by an insulative adhesive BD, such as silicone resin. The signal processing chip SCd is fixed to the acceleration detecting chip ACd by an insulative adhesive BD, such as silicone resin, which is applied in the form of a frame on the acceleration detecting chip ACd, so as to surround the acceleration detecting part AS. The die pad DPa, leads LD, acceleration detecting chip ACd and signal processing chip SCd are encapsulated by a resin encapsulation package PK.

For sake of simplicity, in FIG. 13, the leads LD, bonding wires WR connected to the leads LD, and resin encapsulation package PK are not illustrated, and the signal processing chip SCd is indicated by broken line, in order to show the acceleration detecting part AS. The fifth preferred embodiment also illustrates an acceleration sensor of the SOP type, as in the first preferred embodiment.

The acceleration detecting chip ACd has on its surface pad electrodes PDa for outputting the electrical signal from the acceleration detecting part AS, pad electrodes PDd for receiving the output from the signal processing chip SCd, pad electrodes PDe for making connection with the leads LD, and wiring layers IL for making connection between the pad electrodes PDd and PDe.

Unlike the fourth preferred embodiment, none of signal processing wiring layer, circuit elements, etc., are provided on the upper surface of the signal processing chip SCd, and these components are provided on the bottom of the signal processing chip SCd. That is, on the bottom of the signal processing chip SCd, there are formed pad electrodes PDb for receiving the output from the pad electrodes PDa of the acceleration detecting chip ACd, pad electrodes PDc for outputting the processed signal, signal processing wiring layer, and circuit elements (not shown).

A direct connection is established between the pad electrodes PDa and PDb, and between the pad electrodes PDc and PDd.

Thus, in the acceleration sensor of the fifth preferred embodiment, the signal processing chip SCd overlies the acceleration detecting chip ACd, as in the fourth preferred embodiment. This allows for a reduction in the area of the die pad than if the acceleration detecting chip and signal processing chip were provided in a parallel arrangement on the die pad. it is therefore able to reduce the size of the acceleration sensor. In addition, by employing the resin encapsulation package PK that covers the acceleration detecting chip ACd, signal processing chip SCd and die pad DPa, more miniaturization can be achieved than would be the case with a metal package.

Further, the pad electrodes PDb and PDc are disposed on the bottom not the upper surface of the signal processing chip SCd, in order to make a direct connection with the pad electrodes PDa and PDd of the acceleration detecting chip ACd. With this arrangement, no bonding wiring is required in establishing electrical connection between both chips. This permits an improvement in productivity, without causing any wire sweep which is liable to occur by the use of a bonding wire (i.e., this is the phenomenon that when forming a resin encapsulation package, the bonding wire is swept due to the resin flow).

Furthermore, the bottom of the signal processing chip SCd is fixed to the surface of the acceleration detecting chip ACd, by adhesive BD that is applied in the form of a frame on the acceleration detecting chip ACd, so as to surround at least the acceleration detecting part AS. Thereby, even if these chips cannot be close together, by the presence of the respective electrodes, the acceleration detecting part AS is not subjected to exposure. Therefore, when forming a resin encapsulation package, there is no possibility of the resin flowing into the acceleration detecting part AS. It is unnecessary to provide a cap covering the acceleration detecting part AS, and the number of components is thus lessened to reduce the cost.

Japanese Patent Application Laid-Open No. 11-94506 (1999) discloses a technique relevant to the acceleration sensor of the fifth preferred embodiment. However, this technique differs from the present invention for lack of the viewpoint of preventing the flow of resin into the acceleration detecting part AS, when forming a resin encapsulation package.

Sixth Preferred Embodiment

Figure 16:
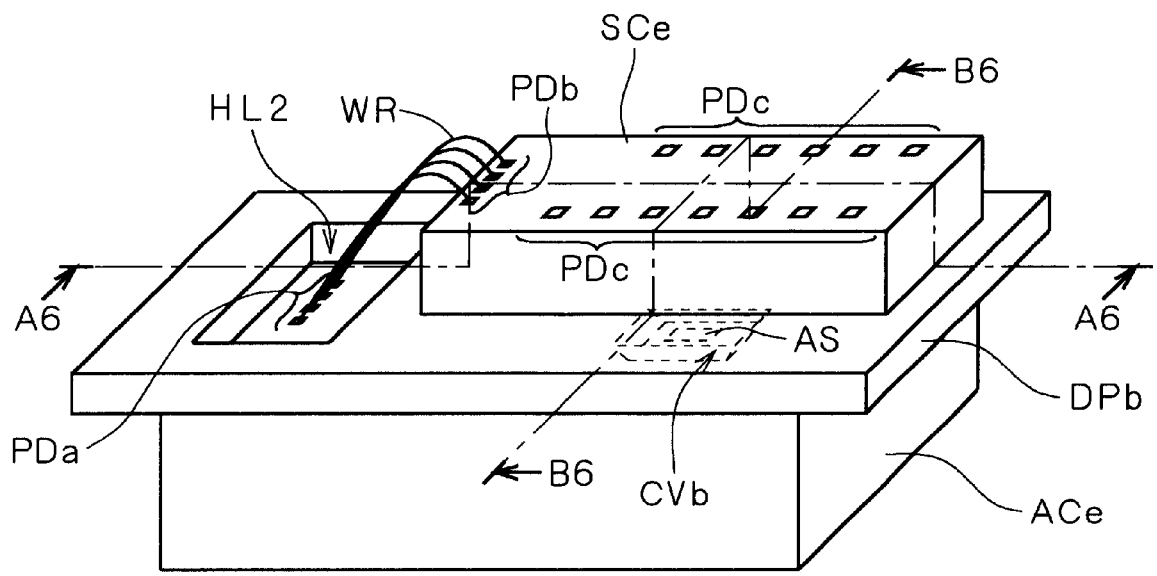
FIG. 16 is a perspective view of an acceleration sensor according to a sixth preferred embodiment.
Figure 17:
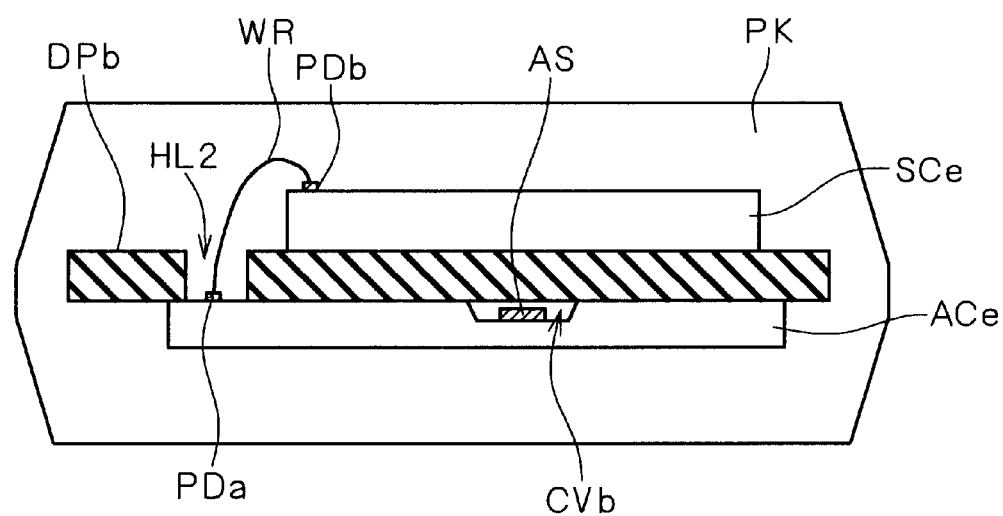
FIGS. 17 and 18 are sectional views of the above acceleration sensor.
Figure 18:
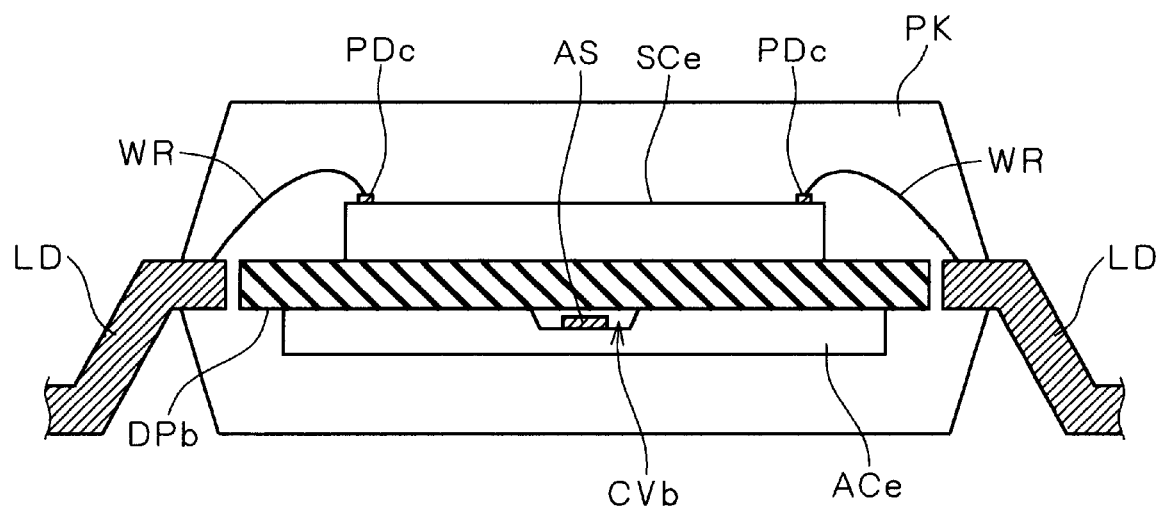

FIGS. 16 to 18 are diagrams illustrating an acceleration sensor according to a sixth preferred embodiment of the invention. FIG. 16 is a perspective view, FIG. 17 is a sectional view taken along the line A6—A6 of FIG. 16, and FIG. 18 is a sectional view taken along the line B6—B6 of FIG. 16.

The acceleration sensor comprises a die pad DPb having a through-hole HL2, and leads LD. The bottom of the die pad DPb is adhered to the surface of an acceleration detecting chip ACe that has on its surface an acceleration detecting part AS. The acceleration detecting part AS is disposed in a concave CVb formed in the surface of the acceleration detecting chip ACe. With this arrangement, a movable electrode ME can be kept away, from the bottom of the die pad DPb.

Disposed on the die pad DPb is a signal processing chip SCe. The acceleration detecting chip ACe and signal processing chip SCe are fixed to the die pad DPb, by an insulative adhesive, such as silicone resin. The die pad DPb, leads LD, acceleration detecting chip ACe and signal processing chip SCe are encapsulated by a resin encapsulation package PK.

For sake of simplicity, in FIG. 16, the leads LD, bonding wires WR connected to the leads LD, and resin encapsulation package PK are not illustrated, and the acceleration detecting part AS and concave CVb are indicated by broken line. The sixth preferred embodiment also illustrates an acceleration sensor of the SOP type, as in the first preferred embodiment.

The acceleration detecting chip ACe has on its surface pad electrodes PDa for outputting the electrical signal from the acceleration detecting part AS. The pad electrodes PDa are exposed in the through-hole HL2 of the die pad DPb. The signal processing chip SCe has on its surface pad electrodes PDb for receiving the output from the pad electrodes PDa of the acceleration detecting chip ACe, and pad electrodes PDc for outputting the processed signal via the leads LD to the exterior. Since the pad electrodes PDa are exposed in the through-hole HL2 of the die pad DPb, an electrical connection can be established between the acceleration detecting chip ACe and signal processing chip SCe. On the surface of the signal processing chip SCe, there are formed signal processing wiring layer, circuit elements, etc. (not shown), as in the signal processing chip SCa. The connection between the pad electrode PDa and pad electrodes PDb, and that between the pad electrodes PDc and leads LD, are made by a bonding wire WR that is, for example, composed of Au.

The arrangement of both chips in the sixth preferred embodiment is different from that in the first preferred embodiment. That is, the signal processing chip SCe overlies the die pad DPb, and the acceleration detecting chip ACe underlies the die pad DPb. This enables to reduce the area of the die pad than if the acceleration detecting chip and signal processing chip were provided in a parallel arrangement on the die pad. It is therefore able to reduce the size of the acceleration sensor.

With the acceleration sensor of the sixth preferred embodiment, the surface of the acceleration detecting chip ACe is adhered to the bottom of the die pad DPb, and the bottom of the signal processing chip SCe is adhered to the surface of the die pad DPb. This enables to reduce the area of the die pad than if the acceleration detecting chip and signal processing chip were provided in a parallel arrangement on the die pad, thereby reducing the size of the acceleration sensor.

In addition, by employing the resin encapsulation package PK that covers the acceleration detecting chip ACe, signal processing chip SCe and die pad DPb, more miniaturization can be achieved than would be the case with a metal package.

Moreover, the acceleration detecting part AS of the acceleration detecting chip ACe is disposed on the surface of the chip ACe, and the surface of the chip ACe is adhered to the bottom of the die pad DPb, thereby the acceleration detecting part AS is not subjected to exposure. Therefore, when forming a resin encapsulation package, there is no possibility of the resin flowing into the acceleration detecting part AS. It is unnecessary to provide a cap covering the acceleration detecting part AS, and the number of components is thus lessened to reduce the cost. Furthermore, since the acceleration detecting part AS is covered in the concave CVb in the surface of the acceleration detecting chip ACe, a movable electrode ME can be kept away from the bottom of the die pad DPb.

Seventh Preferred Embodiment

Figure 19:
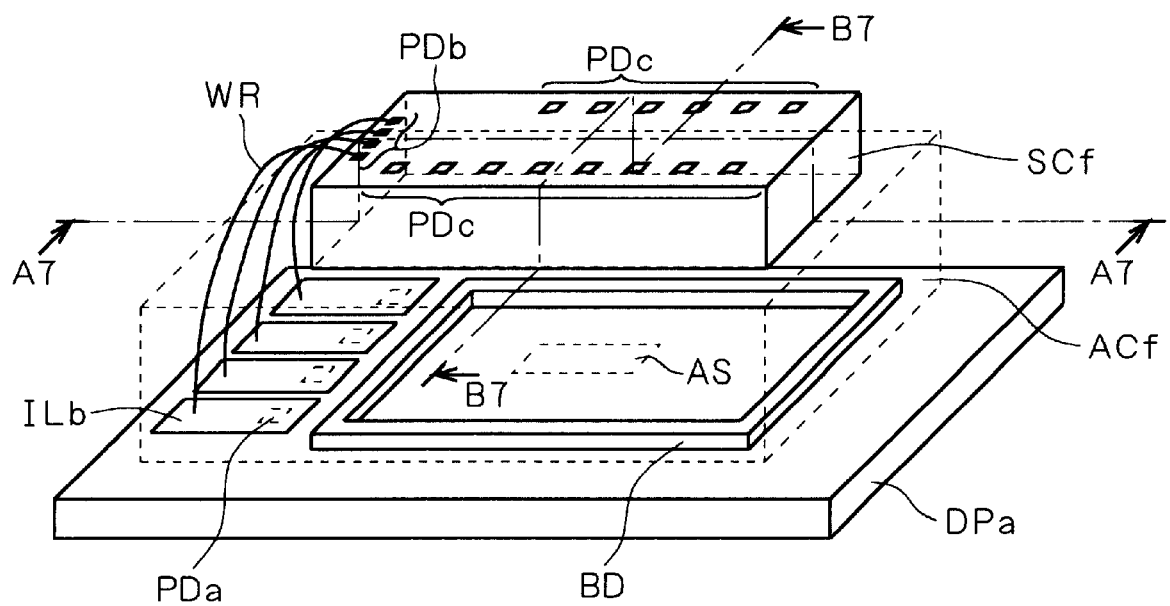
FIG. 19 is a perspective view of an acceleration sensor according to a seventh preferred embodiment.
Figure 20:
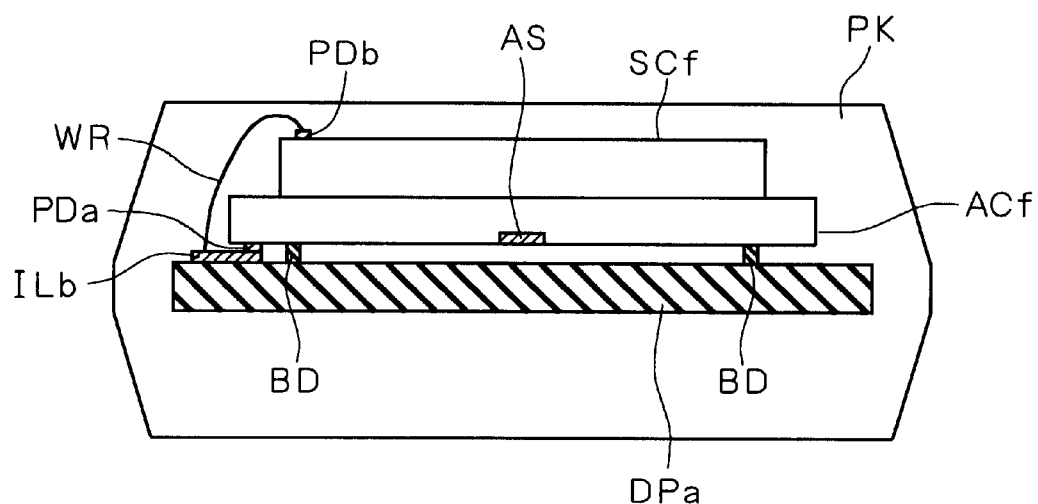
FIGS. 20 and 21 are sectional views of the above acceleration sensor.
Figure 21:
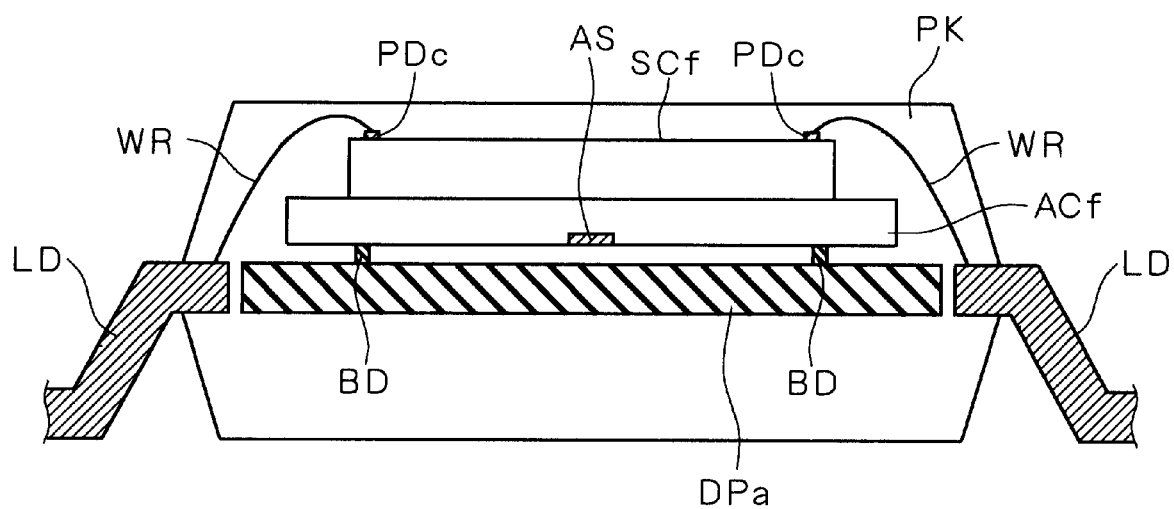
Figure 22:
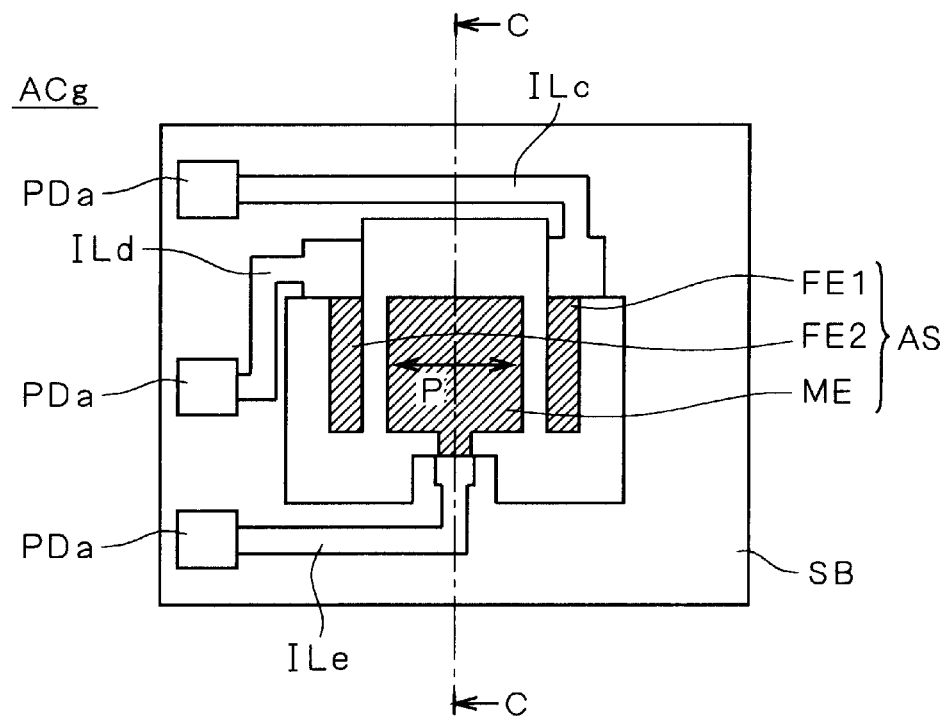
FIG. 22 is a top plan view of an acceleration detecting chip.
Figure 23:
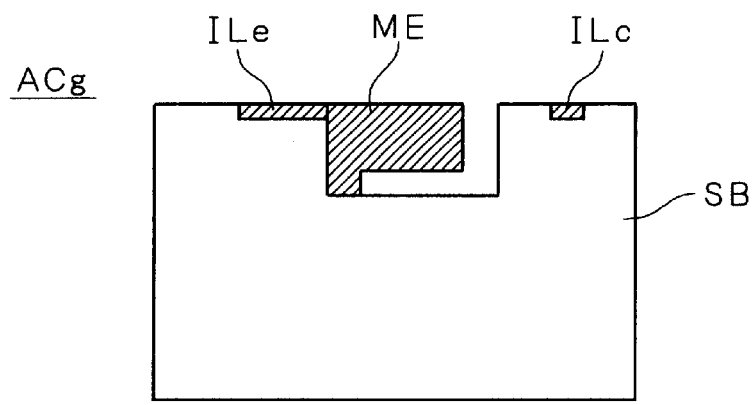
FIG. 23 is a sectional view of the above acceleration detecting chip.

FIGS. 19 to 21 are diagrams illustrating an acceleration sensor according to a seventh preferred embodiment of the invention. FIG. 19 is a perspective view, FIG. 20 is a sectional view taken along the line A7—A7 of FIG. 19, and FIG. 21 is a sectional view taken along the line B7—B7 of FIG. 19.

The acceleration sensor comprises a die pad DPa and leads LD. The surface of the die pad DPa is adhered via adhesive BD to the bottom of an acceleration detecting chip ACf that has on its bottom an acceleration detecting part AS. The adhesive BD is an insulative adhesive, such as silicone resin, and is applied in the form of a frame to the bottom of the acceleration detecting chip ACf, so as to surround at least the acceleration detecting part AS. With this arrangement, a movable electrode ME of the acceleration detecting part AS can be kept away from the surface of the die pad DPa, by the amount of the thickness of the adhesive BD.

Disposed on the acceleration detecting chip ACf is a signal processing chip SCf, which is fixed to the acceleration detecting chip ACf by an insulative adhesive, such as silicone resin. The die pad DPa, leads LD, acceleration detecting chip ACf and signal processing chip SCf are encapsulated by a resin encapsulation package PK.

For sake of simplicity, in FIG. 19, the leads LD, bonding wires WR connected to the leads LD, and resin encapsulation package PK are not illustrated, and the acceleration detecting chip ACf is indicated by broken line. The seventh preferred embodiment also illustrates an acceleration sensor of the SOP type, as in the first preferred embodiment.

The acceleration detecting chip ACf has on its bottom pad electrodes PDa for outputting the electrical signal from the acceleration detecting part AS. The pad electrodes PDa are connected to wiring layers ILb provided on the die pad DPa. The signal processing chip SCf has, on its surface, pad electrodes PDb to which the bonding wires WR connected to the wiring layers ILb are connected, and pad electrodes PDc for outputting the processed signal via the leads LD to the exterior. Since the pad electrodes PDa are connected to the wiring layers ILb on the die pad DPa, an electrical connection can be established between the acceleration detecting chip ACf and signal processing chip SCf. On the surface of the signal processing chip SCf, there are formed signal processing wiring layer, circuit elements, etc. (not shown), as in the signal processing chip SCa. The connection between the pad electrode PDc and leads LD is made by a bonding wire WR that is, for example, composed of Au.

The arrangement of both chips in the seventh preferred embodiment is different from that in the first preferred embodiment. That is, the signal processing chip SCf overlies the acceleration detecting chip ACf, and the acceleration detecting chip ACf overlies the die pad DPa. This allows for a reduction in the area of the die pad than if the acceleration detecting chip and signal processing chip were provided in a parallel arrangement on the die pad. It is therefore able to reduce the size of the acceleration sensor.

With the acceleration sensor of the seventh preferred embodiment, the bottom of the acceleration detecting chip ACf is adhered to the surface of the die pad DPa, and the bottom of the signal processing chip SCf is adhered to the surface of the acceleration detecting chip ACf. This allows for a reduction in the area of the die pad than if the acceleration detecting chip and signal processing chip were provided in a parallel arrangement on the die pad, thereby reducing the size of the acceleration sensor.

In addition, by employing the resin encapsulation package PK that covers the acceleration detecting chip ACf, signal processing chip SCf and die pad DPa, more miniaturization can be achieved than would be the case with a metal package.

Moreover, the acceleration detecting part AS of the acceleration detecting chip ACf is disposed on the bottom of the chip ACf, and the bottom of the chip ACf is adhered to the surface of the die pad DPa, thereby the acceleration detecting part AS is not subjected to exposure. Therefore, when forming a resin encapsulation package, there is no possibility of the resin flowing into the acceleration detecting part AS. It is unnecessary to provide a cap covering the acceleration detecting part AS, and the number of components is thus lessened to reduce the cost. In addition, by the presence of the adhesive BD that is applied in the form of a frame to the bottom of the acceleration detecting chip ACf, so as to surround at least the acceleration detecting part AS, the bottom of the acceleration detecting chip ACf is adhered to the surface of the die pad DPa. Therefore, a movable electrode ME of the acceleration detecting part AS can be kept away from the surface of the die pad DPa, by the amount of the thickness of the adhesive BD.

While the invention has been shown and described in detail, the foregoing description is in all aspects illustrative and not restrictive. It is therefore understood that numerous modifications and variations can be devised without departing from the scope of the invention.

What is claimed is:

1. An acceleration sensor comprising:

an acceleration detecting chip including an acceleration detecting part having a movable part that shifts depending on acceleration, so that said chip outputs an electrical signal depending on the shift of said movable part;

a signal processing chip having a through-hole and a circuit for processing said electrical signal from said acceleration detecting chip; and a die pad to which said acceleration detecting chip and said signal processing chip are adhered, wherein said acceleration detecting chip is disposed in said through-hole of said signal processing chip on said die pad.

2. The acceleration sensor according to claim 1, further comprising:

a cap adhered to said signal processing chip so as to cover said through-hole; and a resin encapsulation package covering at least an adhesive portion between said signal processing chip and said cap.

3. The acceleration sensor according to claim 2, wherein said acceleration detecting chip further comprises an electrode for outputting said electrical signal, and said signal processing chip further comprises an electrode connected via a bonding wire to said electrode of said acceleration detecting chip.

4. The acceleration sensor according to claim 2, wherein, said cap is a plate-like and has a notch about its periphery;

an electrical connection between said acceleration detecting chip and said signal processing chip is established at said notch; and said notch is filled with an insulating material.

5. The acceleration sensor according to claim 1, further comprising:

a cap adhered to said acceleration detecting chip so as to cover said acceleration detecting part of said acceleration detecting chip; and a resin encapsulation package covering at least an adhesive portion between said acceleration detecting chip and said cap.

6. The acceleration sensor according to claim 5, wherein said acceleration detecting chip further comprises an electrode for outputting said electrical signal, and said signal processing chip further comprises an electrode connected via a bonding wire to said electrode of said acceleration detecting chip.

* * * * *